(12) United States Patent
Ghirardi

(10) Patent No.: US 7,734,825 B2
(45) Date of Patent: Jun. 8, 2010

(54) TRANSFERRING SNMP MESSAGES OVER UDP WITH COMPRESSION OF PERIODICALLY REPEATING SEQUENCES

(75) Inventor: Maurizio Ghirardi, Turin (IT)

(73) Assignee: Telecom Italia S.p.A., Milan (IT)

( * ) Notice: Subject to any disclaimer, the term of this patent is extended or adjusted under 35 U.S.C. 154(b) by 1040 days.

(21) Appl. No.: 10/486,738

(22) PCT Filed: Aug. 9, 2002

(86) PCT No.: PCT/IT02/00533

§ 371 (c)(1),
(2), (4) Date: Feb. 10, 2004

(87) PCT Pub. No.: WO03/017618

PCT Pub. Date: Feb. 27, 2003

(65) Prior Publication Data

US 2005/0038912 A1 Feb. 17, 2005

(30) Foreign Application Priority Data

Aug. 13, 2001 (IT) .......................... TO2001A0813

(51) Int. Cl.
*G06F 15/16* (2006.01)
(52) U.S. Cl. .................................... 709/247
(58) Field of Classification Search ................. 709/247, 709/223, 224
See application file for complete search history.

(56) References Cited

U.S. PATENT DOCUMENTS

| 5,649,189 | A | * | 7/1997 | Cook .......................... 707/101 |
| 5,790,599 | A | * | 8/1998 | Wright et al. ............... 375/240 |
| 6,028,863 | A | * | 2/2000 | Sasagawa et al. ........... 370/399 |
| 6,044,468 | A | * | 3/2000 | Osmond ........................ 726/5 |
| 6,108,782 | A | * | 8/2000 | Fletcher et al. ............. 713/153 |
| 6,144,859 | A | * | 11/2000 | LaDue ........................ 455/511 |
| 6,219,043 | B1 | * | 4/2001 | Yogeshwar et al. ........... 341/55 |
| 6,441,920 | B1 | * | 8/2002 | Smith ........................ 358/1.2 |
| 6,542,504 | B1 | * | 4/2003 | Mahler et al. ............... 370/392 |
| 6,618,397 | B1 | * | 9/2003 | Huang ........................ 370/474 |
| 7,107,335 | B1 | * | 9/2006 | Arcieri et al. ............... 709/224 |
| 7,197,046 | B1 | * | 3/2007 | Hariharasubrahmanian . 370/466 |
| 7,519,729 | B2 | * | 4/2009 | Motoyama et al. .......... 709/237 |
| 2002/0140585 | A1 | * | 10/2002 | Haggar et al. ................. 341/60 |
| 2005/0038912 | A1 | * | 2/2005 | Ghirardi ..................... 709/247 |
| 2005/0180387 | A1 | * | 8/2005 | Ghirardi ..................... 370/351 |

FOREIGN PATENT DOCUMENTS

WO   WO 00/72517   11/2000

OTHER PUBLICATIONS

RFC1951—Deflate Compressed Data Format Specification Version 1.3, May 1996.*
SNMP Object Identifier Compression—Revision 1.9 (Apr. 2001).

(Continued)

*Primary Examiner*—J Bret Dennison
(74) *Attorney, Agent, or Firm*—Banner & Witcoff, Ltd.

(57) ABSTRACT

UDP messages incorporating respective payloads are transferred by the steps of first encoding each of the payloads into hexadecimal format and then compressing the encoded payloads based on the recognition of sequences that periodically appear in the respective messages.

9 Claims, 5 Drawing Sheets

OTHER PUBLICATIONS

Efficient Transfer of Bulk SNMP Data (Apr. 2001).
SNMP Payload Compression—Rev. Apr. 2001.
IP Header Compression by M. Degermark et al. (Lulea Univ. Network Working Group Feb. 1999).
SNMP Object Identification Compression by S. McLeod et al. (Internet Engineering Task Force, Apr. 2001)EFFICIENT.
Efficient Transfer of Bulk SNMP Data by S. Chnadragiri (Ranch Networks Apr. 2001).

* cited by examiner

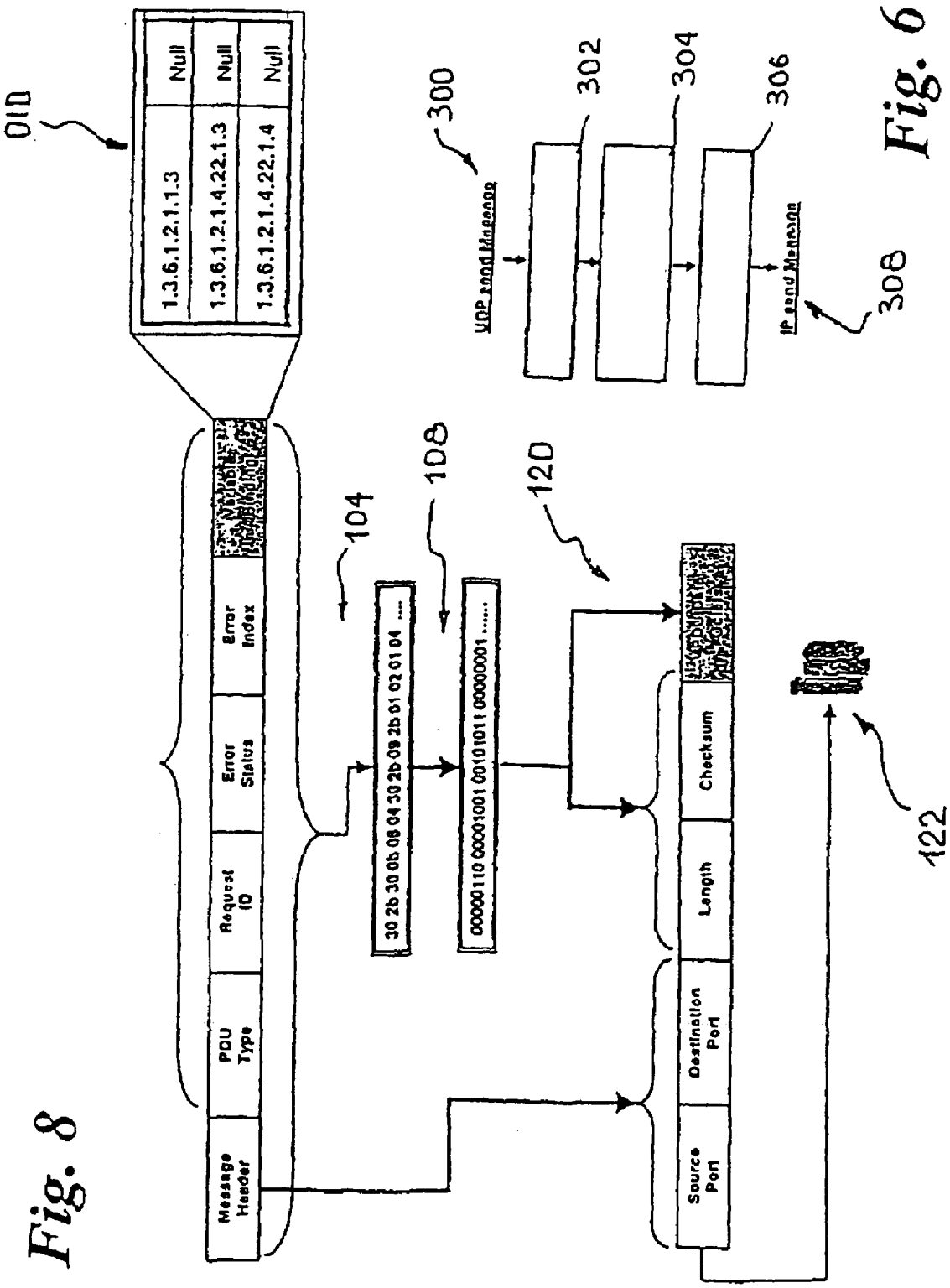

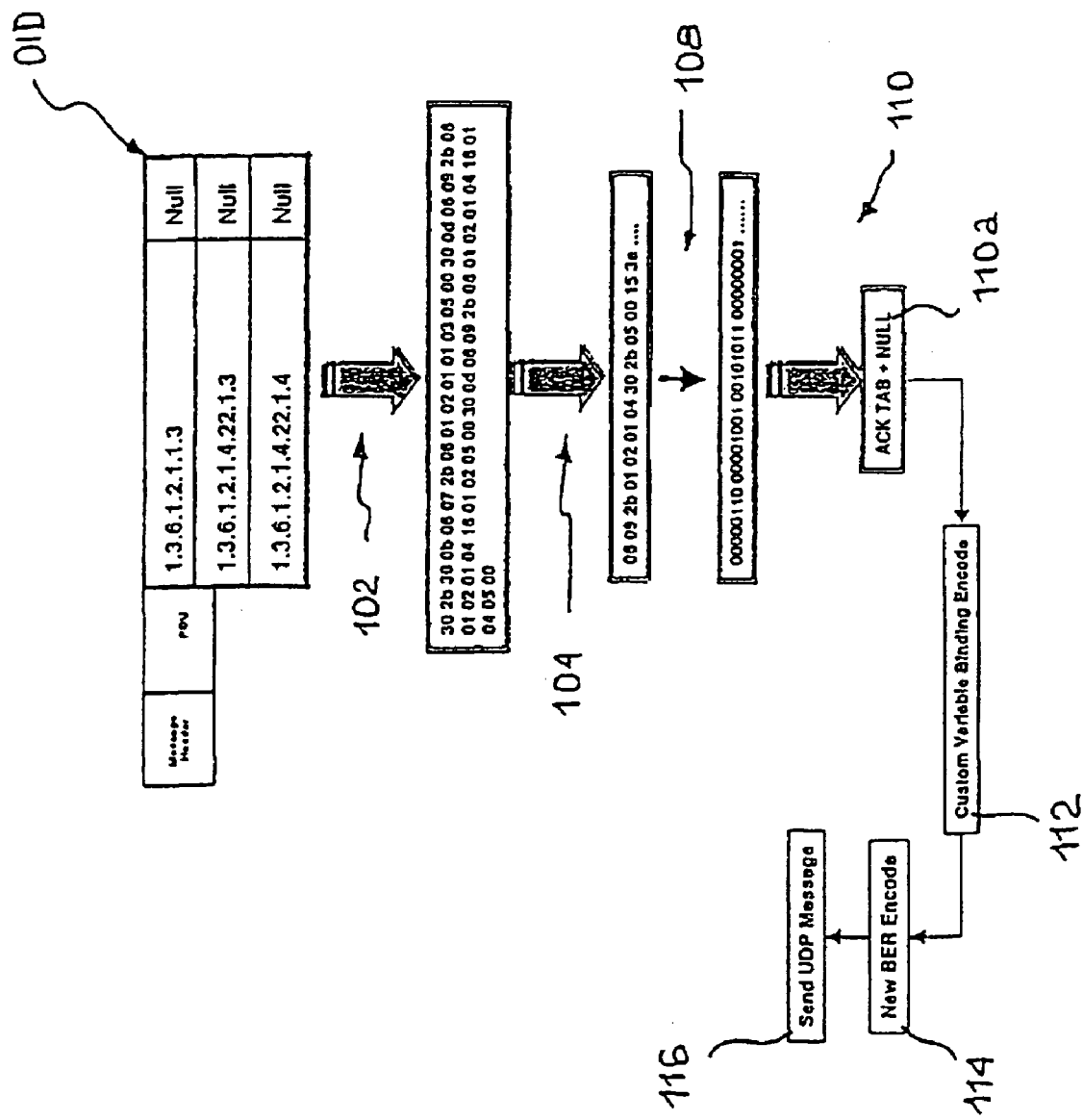

TRANSFERRING SNMP MESSAGES OVER UDP WITH COMPRESSION OF PERIODICALLY REPEATING SEQUENCES

CROSS REFERENCE TO RELATED APPLICATIONS

This application is the US national phase of PCT application PCT/IT02/00533, filed 9 Aug. 2002, published 27 Feb. 2003 as WO 2003/017618, and claiming the priority of Italian patent application TO2001A000813 itself filed 13 Aug. 2001, whose entire disclosures are herewith incorporated by reference.

FIELD OF THE INVENTION

This invention concerns the transfer of messages using an UDP (short for User Datagram Protocol) transport, such as for instance the SNMP (Simple Network Management Protocol) messages.

BACKGROUND OF THE INVENTION

These messages are generated and transmitted within data communication networks, such as the internet. The architecture of the internet protocols is based on four logic layers, i.e. application, transport, network, and link.

The SNMP messages perform a simple communication mechanism between a Network Manager System (NMS) and the nodes being managed. This is made possible through specific applications located respectively at the NMS called "Network Manager" and at the nodes called "agents". The SNMP messages therefore take place at the UDP level, using it as a transport for such a purpose.

The application called "agent" (hereinafter: agent) with its respective network manager over the SNMP messages has associated a database currently called "Management Information Base" or, short, MIB. Within such a database, the information is collected relating to the management and monitoring of the corresponding node or network element. In particular such information includes the following:

MIB variables, that may be read by the Network Manager to derive information about the network element;

MIB variables that may be written by the Network Manager to cause actions on the network element; and events (traps) that the same agent may cause toward the Network Manager (manager) with respect to specific situations.

The communication at SNMP level essentially includes therefore:

messages required to read/write the above variables (GetRequest, GetNextRequest, SetRequest, GetBulk), sent out by the Network Manager, and response messages (GetResponse) and trap messages, transmitted by the agent.

The set of all the variables/traps managed by an agent are bound to the network element and specifically represent the relating MIB, i.e. they show the operation mode and the intrinsic characteristics of the network element to the Network Manager.

Each variable or trap is individually identified by a string in the ASN.1 notation (Abstract Syntax Notation One), called Object IDentifier or OID.

The framework of the string is, for instance, of "1.3.6.1.2.1.4.21" type, indicative of the fact that ASN.1 notation allows the representation of objects according to a hierarchical tree structure.

A part of the MIB has been defined as a standard and is supported by any agent, whereas other variables and some traps are specific for each manufacturer and in some cases also characteristic of a particular apparatus typology.

The SNMP protocol, born in 1988, has undergone some evolutions during the years. In particular new messages typologies have been defined which the agents must be able to understand. The MIB standard, that each agent must be able to support, has been extended. On the filing date of this application, the versions being used are the 1st and the 2nd versions, whereas the standardization of version 3 is currently under way.

The size of a MIB varies according to the apparatus type and can even be of the order of some hundred kBytes, corresponding to some hundred OIDs.

The diagram in FIG. 1 of the attached drawings shows the typical components of an SNMP message. The content of each component is written in ASCII characters and its maximum permissible size is equal to the maximum size of an UDP message, the data entity that carries it, equal to 65,507 bytes or octets (of which about 64 kbytes are designed for the information to be carried).

In particular, in the same diagram of FIG. 1 the presence may be noticed of a message header and of a PDU (Protocol Data Unit) part, of which the part denoted by 1 collects messages such as GetRequest, GetNextRequest, SetRequest and GetResponse, the part denoted by 2 collects GetBulk messages, whereas the part denoted by 3 generally concerns trap type messages.

More specifically, in the header of SNMP messages the following information is present:

Version Number: number of the SNMP version used for message composition (V1, V2, V3, . . . ), and Community Name: a kind of password that allows access through reading and writing to the objects contained in the MIB module.

The following information is available within the PDU

PDU type: message typology that in the version 1 contains instructions such as GetRequest, GetNextRequest, SetRequest and Request, whereas version 2 may also contain instructions such as GetBulkRequest and InformRequest;

Request id: individual identifier of the message assigned by the manager and utilised by the agent when answering, in order that the manager might associate the requested response with the appropriate reference;

Error status: set to 0 in all message typologies, except for the response messages, wherein, if set to 1, it means that an error is present;

Error Index: it indicates which one among the requested variables (OID) has caused the error, and—Variable Bindings: these are OID/value pairs; the values are "null" in the case of requests, and compiled in the case of response messages.

In particular, the part just on the left side of FIG. 1 shows a typical structure of the part collecting the above Variable Bindings.

In the present invention and in the captions appearing in some figures of the appended drawings, the choice has been made of mentioning—for the different elements being considered—the corresponding acronyms/names/initials in the English language.

This has been done for the sake of a clear and straightforward description. The above acronyms, names and initials are currently used at international level by those skilled in the art, since no translations into the different national languages have been developed during the years.

The transmission of the SNMP message, made possible over UDP, allows the data packet exchange between two computers linked to the network. The UDP message format namely consists of a header whose main data are the IP address of the computer transmitting the message, the IP address of the destination computer and the size of the PDU being transported. In turn, the PDU format is formed by a header part and by a data part currently called "Payload" or "Octet Data". The header therefore contains the following data: source port, destination port, size of the transported unit, integrity check (CHECKSUM) of the data unit.

The methodology currently adopted for transferring a SNMP messages over UDP (from the manager to the agent, and vice-versa) is based in essence on the fact that the complete SNMP message is coded by means of the BER (Basic Encoding Rules) methodology. This way of operating allows one to convert the bytes forming the SNMP message into a hexadecimal structure suitable to be used as a payload of the UDP message.

The UDP transfer service of the data thus obtained essentially envisages:
- at the transmission stage: reading of the SNMP message and subsequent hexadecimal coding (BER encode) of the message, for its transmission over UDP, and
- at the reception stage: after the reception over UDP, the hexadecimal decoding (BER decode) of the PDU and the subsequent reconstruction of the message.

The current application practice proves that in the data communication networks such as internet, the need arises of transferring a bulk of information in terms of requests/responses conveyed in the form of SNMP messages.

Owing to the total size of the information, the time required for the relating transfer and network traffic thus generated, the solutions conventionally adopted for transferring SNMP messages in a standard format generally exhibit a rather poor efficiency.

For this reason three IEFT specifications have already been proposed-at a draft level-to tackle the issue.

The first proposal (known as SNMP Object Identifier Compression, rev. April 2001—draft-ietf-eos-oidcompression-00.txt) is based on the concept that the majority of the information' contained in the MIB is referred to by OID, formed by a constant and rather large part and by a variable and very small part. Starting from this principle, the proposal aim is the encoding, according to an algorithm, of the constant part of the OID through a shorter numbering. This solution optimises only in part the quantity of information being transferred, without considerably reducing its size.

The second proposal (known as "Efficient Transfer of Bulk SNMP Data, rev. April 2001—draft-ietf-eos-snmpbulk-00.txt") faces the issue of the management of the GetBulk instruction that allows the simultaneous collection of a given set of information. The instruction introduced in the SNMP version 2 does not allow the optimisation of the collection, since the manager has to declare the number of elements to be collected, without knowing how many elements form the set of information requested. Amendments to the UDP protocols have been suggested with a modification of the encode algorithm of the message (from BER to PER, which stands for Packet Encoding Rules) or with resort to a transfer mode of FTP (acronym of File Transfer Protocol) type. The solution described in the above cited document, is the introduction of a new instruction at the agent side, called GetColsRequest, and of relating message at manager side, capable of recognising the number of elements to be transferred, identifying the end of the requested set and optimising therefore requests and network traffic. However, also this solution does not allow one to optmise the management of sizes and number of messages being sent.

The third solution taken into account (known as "SNMP Payload Compression-rev. April 2001—draft-irtf-nmrg-snmp-compression-01.txt") is in principle similar to the first proposal, since it suggests a differential encoding algorithm called "OID Delta Compression" or ODC. Starting from an OID root, such a solution envisages to memorise the subsequent OID assigning to the OID a code associated to the OID root, followed by the varying part of OID. Substantially, the variations are stored in terms of differential increments, as compared to the root element. This solution has the drawback of being incompatible with previous versions of the protocol.

Further, it allows an estimated saving by about 30% for particularly recursive OID values, i.e. data arrays, and it is substantially inefficient in the event of a low number of recursive items.

OBJECT OF THE INVENTION

The object of the present invention is to provide an alternative solution as compared to the solution set out before, so as to allow an optimised transfer over UDP of messages such as SNMP messages, without affecting the protocol and the performance at the agent's as well at the manager's side.

SUMMARY OF THE INVENTION

According to the present invention, this object is attained by means of a novel below-descried method. The invention also concerns, in a separate way, the relating system and the data processing product, directly loadable into the internal memory of a computer and incorporating parts of software code to implement the method according to the invention, when the above data processing product runs on a computer.

In essence, the solution according to the invention is based on the compression of the whole message (header and PDU).

In particular two different transfer modes are proposed.

The first one encapsulates the SNMP message into a new SNMP message of proprietary type, and sends it in a standard mode using UDP.

The second one directly drives UDP through a driver providing the result of the SNMP message compression as Data Octet.

The compression technique is essentially based on the recognition of sequences appearing periodically within the message.

In a particularly preferred embodiment of the invention, the compression technique being used is a variation of the technique known as LZ77 (see the work by Ziv. J., Lempel A., "A Universal Algorithm for Sequential Data Compression", IEEE. Transactions on Information Theory, Vol. 23, No. 3, pp. 337-343), well-known in the UNIX environment and called gzip (gzip format-RFC 1952), also used by the more popular PKZIP. The specifications of such a technique are commonly known, and there are also source libraries available, that implement and use such a solution for different development environments and operating systems, such as HP-UX, Digital, BeOS, Linux, OS/2, Java, Win32, WinCE.

In particular it is possible to use a porting of the algorithm on win32 by using a "zLib" library. For consultation, reference can be made to the site http://www.info-zip.org/pub/infozip/zlib/. The main feature of this library is to allow the runtime and on-memory compression of both binary data structures and strings, this being an important factor relating to the system performance.

BRIEF DESCRIPTION OF DRAWINGS

The invention will now be described by way of a non-limiting example, with reference to the attached drawings, wherein:

FIG. 6 is an additional flow chart illustrating the general characteristics of the solution according to the invention; and FIGS. 7 and 8 depict, according to modalities substantially similar to those adopted in FIG. 1, the embodiment criteria of the solution according to the invention, illustrated in two possible variations.

BEST MODE FOR CARRYING OUT THE INVENTION

Figure 2:
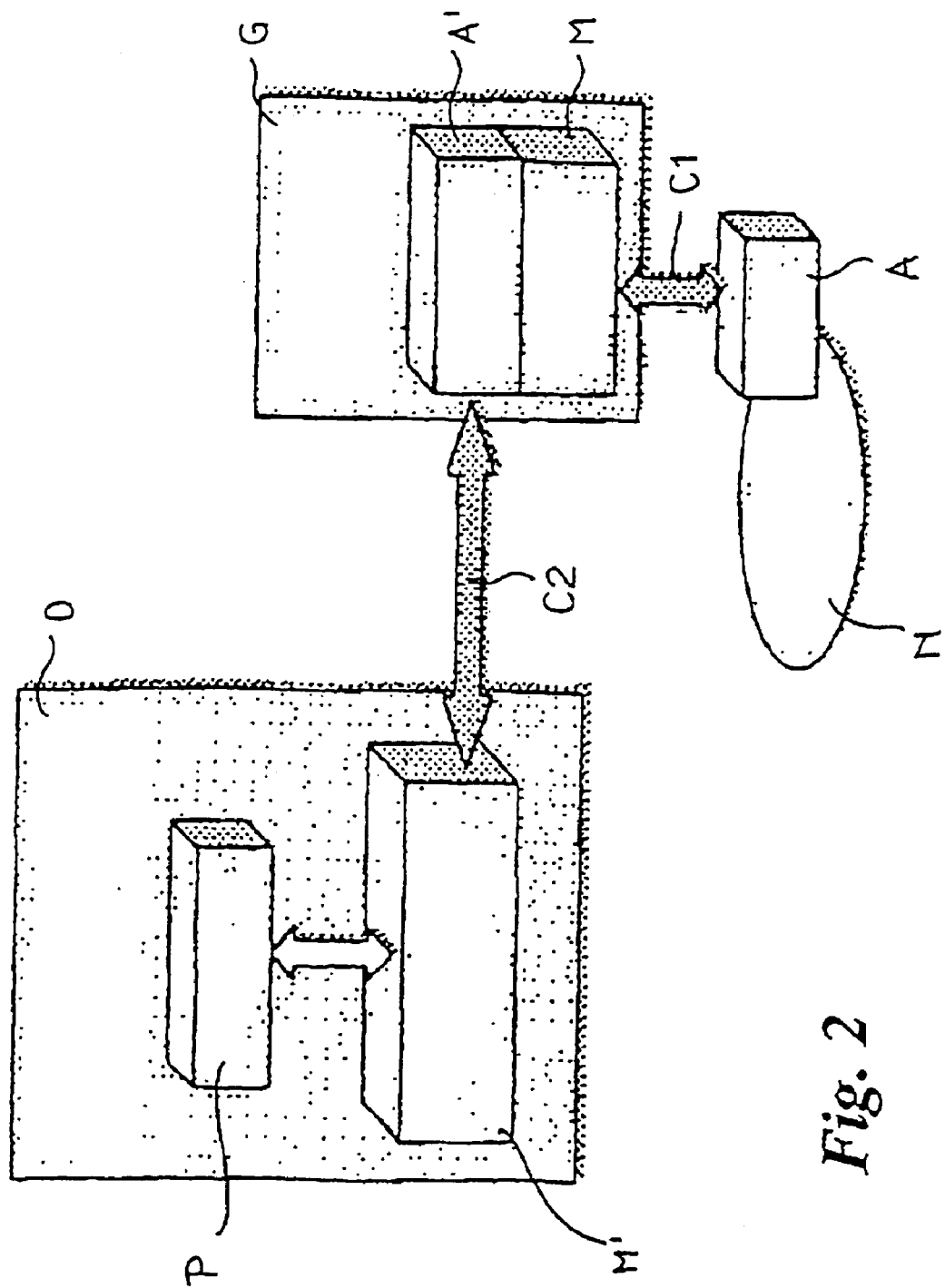
FIG. 2 shows in the form of a general block diagram a typical application architecture of the solution according to the invention.

Within the general diagram of FIG. 2, reference N indicates a data communication network (as an immediate example, one may consider internet) defining the typical application environment of the solution according to the invention.

Reference A shows the module currently called "agent", that carries out the function of controlling and monitoring a corresponding element of the network N, operating in a-bi-directional-dialog mode with a corresponding manager M.

The latter defines, along with an additional agent A' of a higher hierarchical level, a port or gate G, that in turn interfaces with an additional manager M' of a higher hierarchical level.

The latter one defines along with a corresponding application, an observation module or observer 0.

References C1 and C2 indicate two bi-directional communication channels that perform the communication-at a lower hierarchical level-between agent A and gate G, and-at a higher hierarchical level-between gate G and observer 0.

The above-cited channels C1, C2 are those over which the transmission of SNMP messages takes place.

Figure 3:
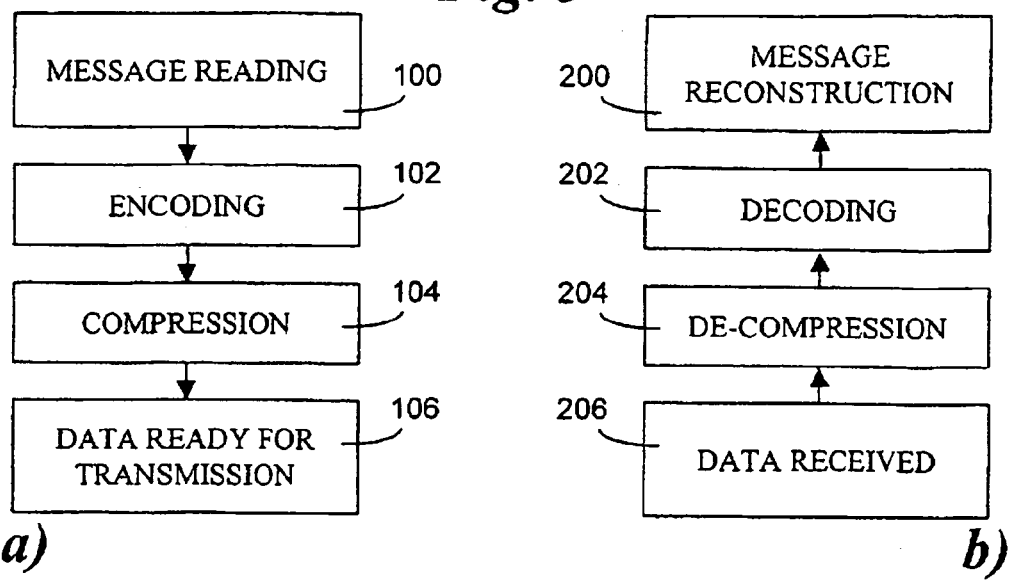
FIGS. 3 to 5, each subdivided into two parts relating to transmission (part a) and to reception (part b) respectively, illustrate different types of embodiments of the solution according to the invention in the form of a flow chart.

Flow charts of FIG. 3 depict the modalities adopted for the compression (FIG. 3a) and decompression (FIG. 3b) of the SNMP message.

Figure 4:
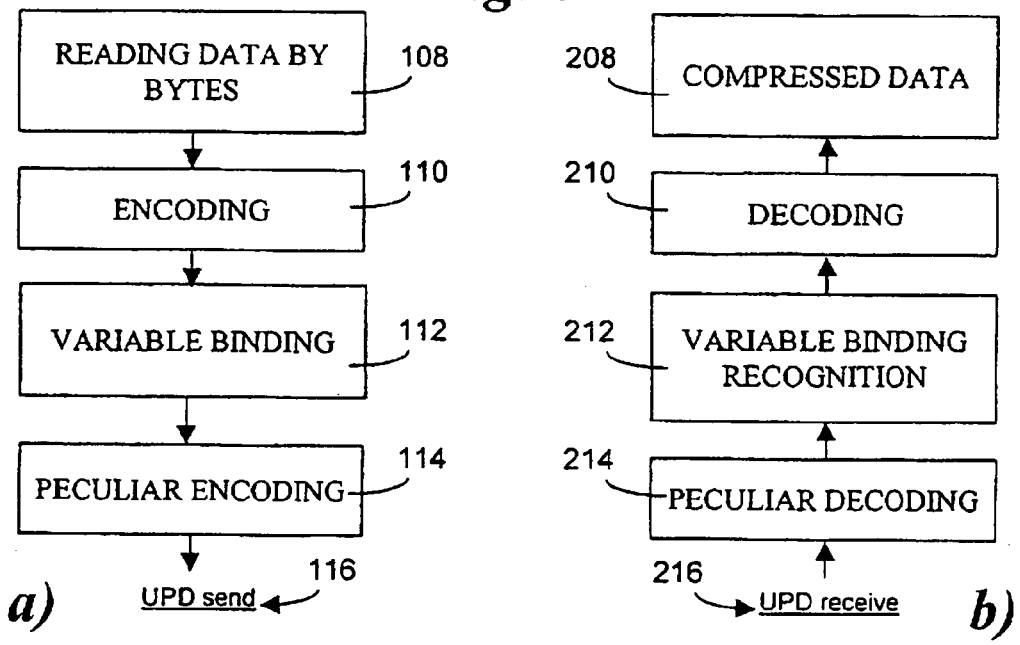

Flow charts of FIG. 4 illustrate (still making reference to transmission—FIG. 4a—and to reception—FIG. 4b) a first solution which envisages the transfer of the compressed SNMP message through encapsulation over SNMP.

Figure 5:
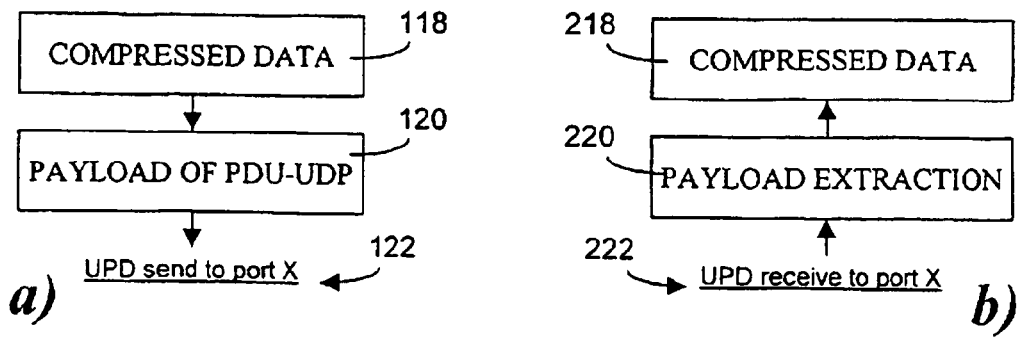

Flow charts of FIG. 5 refer instead to a transfer solution through encapsulation over UDP. This still makes specific reference to transmission (FIG. 5a) and reception (FIG. 5b).

Figure 1:
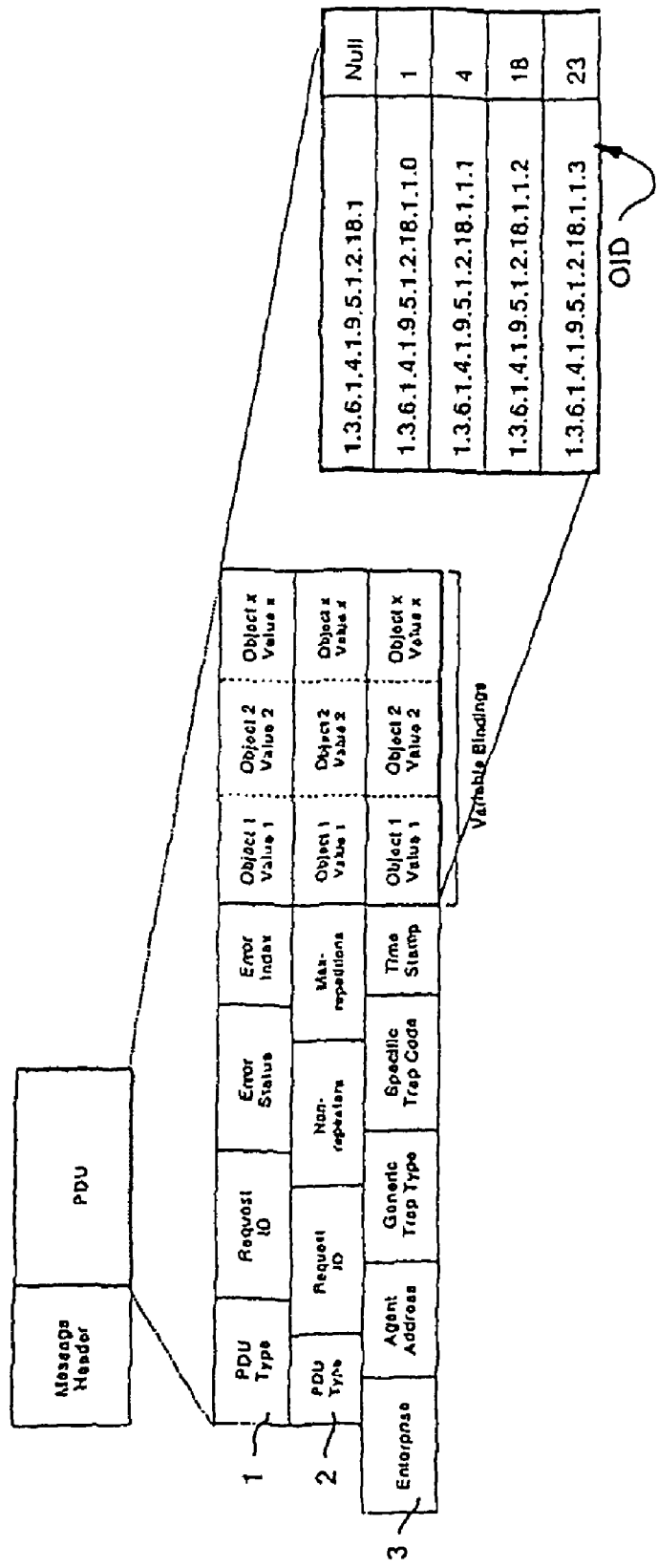
FIG. 1, relating to the prior art, has already been previously described.

The diagrams of FIGS. 7 and 8 depict in relation to the OID representation the same formalism of FIG. 1 and make reference to the set of compression and transmission operations, exemplified by part a) of FIGS. 3 and 4 (FIG. 7) and part a) of FIGS. 3 and 5 (FIG. 8), respectively.

By first examining the flow chart of FIG. 3, reference 100 identifies the step during which the whole SNMP message (header+PDU) is read in order to be then converted or encoded into a hexadecimal format during a subsequent step denoted by 102. This is brought about by applying a coding of BER encode type.

The message thus encoded is then compressed by using a compression technique based on the recognition of recursive sequences, such as for instance the technique referred to in the zLib library, which has already been mentioned before.

This takes place during a step denoted by 104 so as to obtain during the step indicated by 106, a compressed Data Unit, ready for the transmission.

In a fully symmetrical way, the flow chart of part b of FIG. 3 incorporates four steps, namely 206, 204, 202 and 200 (designed to be performed according to the indicated sequence), wherein the received compressed Data Unit (step 206) is subjected to decompression (step 204) with a view to the subsequent hexadecimal decoding (step 202), with a subsequent reconstruction of the entire SNMP message (step 200).

The fact of having assigned to the part b flow chart of FIG. 3 numerical references sorted in an inverse way with respect to their performance sequence, has the only purpose of underlining the symmetrical character with steps 100 to 106 of the compression procedure. Similar choices have been made with reference to the flow charts of FIGS. 4 and 5.

As already shown, FIGS. 4 and 7 make reference to a transfer solution which envisages the encapsulation of the compressed Data Unit into a standard SNMP message, characterised by a proprietary or peculiar "Variable Binding", by a standard transmission modality over UDP.

The encapsulation modality of the compressed data Unit obtained during step 106 incorporates an initial step, denoted by 108, during which the compressed Data Unit is read by bytes and then converted into the corresponding set of ASCII characters, during a subsequent encoding step denoted by 110.

In the following step, denoted by 112 (which may be possibly preceded by auxiliary functions such as ACK TAB+ NULL—see block 110a of FIG. 7) the "Variable Binding" is generated of the message formed by a first OID with a proprietary or peculiar numbering (for instance 1.3. 6.1. 4.666. 1) which contains in its value the string _ZIP_xxxx, wherein xxxx indicates the size of the original file. In the above cited example, the peculiar code 666.1 has been indicated which—at the moment—has not been registered at IANA (Internet Assigned Numbers Authority), but any other code not registered could be used.

The subsequent elements of the Variable Binding containing the compressed Data Unit, duly converted into ASCII characters, are formed by OID/value pairs. The value contains parts of the compressed Data Unit, converted into ASCII, having a maximum size of 255 characters.

Then the header information of the SNMP message is reconstructed. All this takes place during step 112, that is followed by a step denoted by 114, where an additional encoding according to the BER methodology is performed for generating a PDU payload of the UDP message (payload of PDU-UDP) to be used for data transmission (step 116).

Also in this case, steps denoted by 216, 214, 212, 210 and 208, reproduced in part b) of FIG. 4 and designed to be performed according to the order by which they have been previously cited, represent the dual functions-to be carried out at the receiving side-of steps 108 to 116 relating to the transmission operation.

By adoption of the solution to which FIGS. 4 and 7 are referred, the compressed SNMP message has therefore a standard logic SNMP format, but a proprietary or peculiar content. Thus, it requires a functional extension-albeit minimal-of the agent's manager, such as to allow its recognition and encoding/decoding.

The experiments conducted by the Applicant prove that such a solution is fully feasible, without affecting the network architecture.

The alternative solution to which FIGS. 5 and 8 make reference, envisages the preparation of the compressed Data Unit starting from the SNMP message, according to the modalities shown in FIG. 3, followed by the direct encapsulating of said Data Unit into the payload of PDU-UDP.

Obviously for a correct operation, this solution requires the use of a dedicated transmitter and receiver, for instance under conditions which ensure the availability of a UDP port different from the standard one. The transmitter must therefore know the UDP port used by the receiver, and vice versa. The information about the ports being used may be exchanged at a higher level by means of a synchronisation message in a standard SNMP format, according to criteria to be better explained in the sequel.

When the alternative solution depicted in FIGS. 5 and 8 is adopted, the compressed Data Unit, made available during step 108 and designed to replace the BER of the message, becomes the payload of the PDU-UDP message.

The relating operation is schematised by the steps denoted by 118 and 120 in FIGS. 5 and 8, said steps preceding transmission step 122, designed for the respective dedicated port (generally called port X) of the receiver.

Also in this case, the complementary operation incorporates three steps, denoted by 222 (reception at port Y of the module acting at that moment as a receiver), 220 (extraction of the payload of PDU-UDP), and 218 (getting of the received compressed Data Unit, designed to be transferred toward step 206 of the part b) flow chart of FIG. 3), respectively.

Also in this case steps 222, 220 and 218 are carried out according to the order by which they have been mentioned.

The synchronisation message referred to previously is sent out by the manager to the SNMP agent according to a general principle "application-to-application" using the standard SNMP format containing a proprietary or peculiar "Variable Binding".

The information being transferred may be of the type: OID Value 1.3. 6.1. 4.666. 2<UDPTXPort>1. 3.6. 1.4. 666. 3 <UDP_RX_Port> The manager sends to the SNMP manager a proprietary message compiling the value <UDP-TX-Port> with the number of the port designed to be used for the UDP transmission (for instance 1024) as well as a value <UDPRXPort> with the number of the port that it uses for the UDP reception (for instance 1224).

The agent replies to the manager sending a similar message containing its own information. This method reduces the processing time by improving the solution efficiency.

The block diagram of FIG. 6 additionally shows how the described solution may be generalised so as to be applied to any message typology using UDP as a transport (for instance SNMP, PING, etc.). This generalization makes it possible to implement an UDP driver capable of replacing those presently used.

This solution is capable of evaluating the size of the payload to be transferred, and further proceeding (provided the size is adequate (for instance: more than 20 Bytes) by using the method herein described. To declare the compact nature of the UDP message to the receiver, use can be made of the 8 bits included from bit 62 to bit 69 of the header of the UDP message (at present such bits are not used and are set by default to 0) setting to 1 for instance one or more of such bits.

In particular, in the diagram of FIG. 6, reference 300 indicates any step wherein the need arises of sending a message capable of being transported over UDP, followed by a compression step 302 of the payload, performed according to the modalities described in FIG. 3.

A subsequent step 304 envisages the generation of the UDP message header according to the above-recalled terms, while a subsequent step denoted by 306 corresponds to the creation of the entire UDP message, with a view to its IP transmission, to be performed during a step denoted by 308.

The described methodology allows the implementation of a general purpose solution, capable of supporting any type of application which makes use of the UDP-IP protocol stack.

This solution is particularly suitable for the implementation of hardware or "on chip" solutions.

A functional extension of the described solution, applicable independently of the methodology being used for the data transfer, and the encoding of the message or its equivalent BER or Data Octet UDP. In this regard a safe and effective method appears to be the one currently termed as "block cipher Rijndael", also called "AES".

The solution described herein has the advantage of allowing the compression of SNMP messages-beyond the drawbacks described in the introduction of this description-making reference to a flexible compression technique, in a consolidated way, but also to other compression techniques (such as MPEG). Such a technique and its algorithm can be used in several operating systems, making such a solution a re-usable and re-implementable solution. Further, said solution has a minimum impact both on the manager and the agent, since it requires the set-up of a simple superstructure for compression and decompression of messages.

The solution also proves efficient, since it allows the optimization of the network traffic, by transferring, time intervals being equal, a larger quantity of information or the same quantity of information through a lower number of messages. It is also a safe solution, since being compressed and encoded the information travels within the network in a clear text.

Obviously, while the principle of the invention remains unchanged, the details of the implementation of the invention and its embodiments might be varied considerably with respect to what has been herein described and illustrated, without departing from the spirit and scope of the invention as defined by the appended claims.

The invention claimed is:

1. A method of transferring User Datagram Protocol messages each incorporating a data unit, the method comprising:
   compressing the data unit;
   encoding the compressed data unit into hexadecimal format; and
   encapsulating the encoded results into a Simple Network Management Protocol (SNMP) message having a plurality of variable binding Object Identifier (OID)/value pairs having a common OID code, wherein the encapsulating further includes distributing portions of the encoded results across multiple values of the OID/value pairs having a common OID code.

2. The method according to claim 1 wherein the compression is performed according to a technique of gzip type.

3. A method for receiving messages, comprising:
   receiving, at a receiver device, a Simple Network Management Protocol (SNMP) message;
   identifying a plurality of variable binding Object Identifier (OID)/value pairs in the message, the OIDs in the pairs having a peculiar code;
   assembling a compressed data unit from data values in the identified OID/value pairs having the peculiar code; and
   decompressing the compressed data unit and reconstructing a second SNMP message from the decompressed results.

4. The method according to claim 1, wherein encapsulating the encoded results into a SNMP message comprises:
   reading by bytes the compressed data unit and converting it into ASCII characters; and generating a set of Variable Bindings including a first OID indicative of the size of the original file and subsequent OID/value pairs carrying parts of the compressed data unit converted into ASCII characters.

5. The method according to claim 3 wherein identifying the plurality of variable binding Object Identifier (OID)/value pairs in the message comprises the operations of:

hexadecimal decoding the data values in the identified OID/value pairs.

6. The method of claim 1, further comprising:

using a variable binding OID/value pair to identify a transmission or reception port to be used for SNMP message transmission or reception.

7. The method of claim 1, wherein a first one of the plurality of variable binding OID/value pairs having the common OID code has, as its value, information identifying an original file size for a data file whose data is in the values of the remaining others of the plurality of variable binding OID/value pairs having the common OID code.

8. The method of claim 1, wherein the data that is encoded in the step of encoding includes both an SNMP header and a Protocol Data Unit (PDU) of an SNMP message.

9. The method of claim 1, wherein the common OID code is a portion of the OID.

* * * * *